US012588264B2

(12) United States Patent
Tsui et al.

(10) Patent No.: US 12,588,264 B2
(45) Date of Patent: Mar. 24, 2026

(54) THREE-DIMENSIONAL SOURCE CONTACT STRUCTURE AND FABRICATION PROCESS METHOD OF MAKING THE SAME

(71) Applicant: National Yang Ming Chiao Tung University, Hsinchu City (TW)

(72) Inventors: Bing-Yue Tsui, Hsinchu City (TW); Jui-Cheng Wang, Hsinchu City (TW); Li-Tien Hsueh, Taipei City (TW); Jui-Tse Hsiao, Taichung City (TW)

(73) Assignee: NATIONAL YANG MING CHIAO TUNG UNIVERSITY, Hsinchu City (TW)

( * ) Notice: Subject to any disclaimer, the term of this patent is extended or adjusted under 35 U.S.C. 154(b) by 485 days.

(21) Appl. No.: 18/099,090

(22) Filed: Jan. 19, 2023

(65) Prior Publication Data

US 2024/0096982 A1 Mar. 21, 2024

(30) Foreign Application Priority Data

Sep. 15, 2022 (TW) .................................. 111134907

(51) Int. Cl.
H10D 12/01 (2025.01)
H10D 30/66 (2025.01)
(Continued)

(52) U.S. Cl.
CPC ......... H10D 64/252 (2025.01); H10D 12/031 (2025.01); H10D 30/668 (2025.01); (Continued)

(58) Field of Classification Search
CPC ...... H10D 64/252; H10D 64/01; H10D 64/62; H10D 62/8325; H10D 12/031
See application file for complete search history.

(56) References Cited

U.S. PATENT DOCUMENTS

| | | | |
|---|---|---|---|
| 6,297,100 B1 | 10/2001 | Kumar et al. | |
| 8,476,697 B1 | 7/2013 | Cooper et al. | |

(Continued)

FOREIGN PATENT DOCUMENTS

| | | |
|---|---|---|
| CN | 102956501 A | 3/2013 |
| CN | 111937158 A | 11/2020 |

(Continued)

OTHER PUBLICATIONS

Jiang et al., "A Novel Implant Masking Processes for Double Self-Aligned 4H—SiC DMOSFETs", IEEE PEDS, Jun. 9-12, 2015, Sydney, Australia, pp. 678-680.

*Primary Examiner* — Timor Karimy

(74) *Attorney, Agent, or Firm* — Birch, Stewart, Kolasch & Birch, LLP

(57) ABSTRACT

A three-dimensional source contact structure and fabrication process method thereof are provided. A lithography process and shallow trench process are sequentially performed to form a metal contact window in a power device. A source heavily doped area is divided by the metal contact window into a first and second heavily doped region. A lateral etching process is applied to an inter-layer dielectric to form a first and a second dielectric layer, each of which is in a trapezoid shape. Meanwhile, a first and a second metal-source surface contact regions are exposed. A longitudinal surface exposed by the shallow trench process is beneficial to increase vertical contact when depositing a source contact metal, thereby a step-like three-dimensional source contact structure can be formed. The present invention achieves in reducing cell pitch effectively and can be widely applied to various power devices having MOSFET structure thereof.

8 Claims, 9 Drawing Sheets

(51) Int. Cl.
  *H10D 62/832*         (2025.01)
  *H10D 64/01*         (2025.01)
  *H10D 64/23*         (2025.01)
  *H10D 64/62*         (2025.01)

(52) U.S. Cl.
  CPC ......... *H10D 62/8325* (2025.01); *H10D 64/01*
      (2025.01); *H10D 64/62* (2025.01)

(56)              References Cited

U.S. PATENT DOCUMENTS

2012/0326227 A1 *  12/2012  Burke ................ H10D 30/0295
                                          438/270
2022/0052153 A1 *   2/2022  Su ........................ H10D 30/668

FOREIGN PATENT DOCUMENTS

TW        201301366 A      1/2013
TW        202137554 A     10/2021
TW        202215544 A      4/2022

* cited by examiner

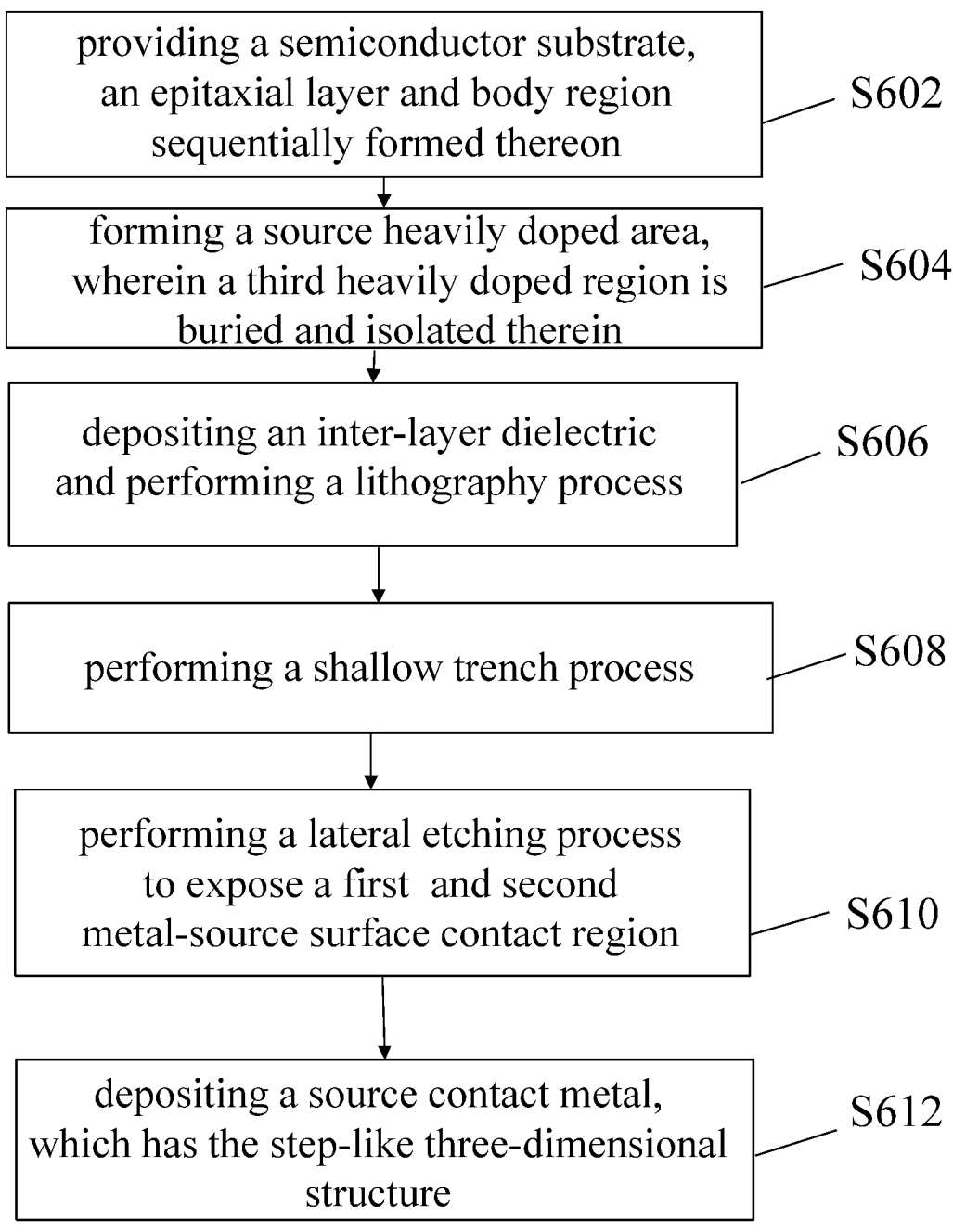

providing a semiconductor substrate,
an epitaxial layer and body region
sequentially formed thereon — S602 forming a source heavily doped area,
wherein a third heavily doped region is
buried and isolated therein — S604 depositing an inter-layer dielectric
and performing a lithography process — S606 performing a shallow trench process — S608 performing a lateral etching process
to expose a first  and second
metal-source surface contact region — S610 depositing a source contact metal,
which has the step-like three-dimensional
structure — S612

Fig.  6

THREE-DIMENSIONAL SOURCE CONTACT STRUCTURE AND FABRICATION PROCESS METHOD OF MAKING THE SAME

This application claims priority of application Ser. No. 111134907 filed in Taiwan on 15 Sep. 2022 under 35 U.S.C. § 119; the entire contents of all of which are hereby incorporated by reference.

BACKGROUND OF THE INVENTION

Field of the Invention

The present invention is related to a source contact structure and its fabrication method. More particularly, it is related to a three-dimensional source contact structure and its fabrication process method by mainly adopting a lateral etching process.

Description of the Prior Art

As known, high-power Metal Oxide Semiconductor Field Effect Transistors (MOSFET) according to different channel types, mainly include: Vertical Double Diffused Metal Oxide Semiconductor Field Effect Transistors (VDMOSFET) with a planar channel, and U-shaped Metal Oxide Semiconductor Field Effect Transistors (UMOSFET) with a vertical channel. In general, it is better for the high-power devices to have a smaller on-resistance. As the device area becomes larger, the on-resistance can be reduced. However, it should be noticed that under the condition of achieving the same on-state current, a larger device area also increases its fabrication cost. Therefore, to properly evaluate the on-resistance of a power device, it is fairly determined on a basis of the "resistance per unit area", which is also known as the specific on-resistance $R_{on,sp}$ (ohm-cm$^2$). It is believed that a lower specific on-resistance $R_{on,sp}$ indicates that the device performance is more superior.

And in order to obtain a high on-state current, it is more likely to parallelly connect a large number of transistors in a power device. Please find FIG. 1 of the present invention for references, in which a less length of the cell pitch 11 is believed to be able to increase the cell density of per unit area, thereby reducing the specific on-resistance $R_{on,sp}$ (ohm-cm$^2$). As a result, it is apparent that one major technique for reducing the specific on-resistance $R_{on,sp}$ (ohm-cm$^2$) of a high power device mainly lies in effectively shortening the cell pitch configured therein the device.

Among the current technologies, it has been provided a plenty of methodologies for shortening the cell pitch. Taking a VDMOSFET as an illustrative example, the methods may include shortening its channel length, reducing the overlapping length of its gate and source regions, reducing the spacing between adjacent P-type bodies (P-body), reducing the width of the contact window, reducing the contact width of the P-body and metal, and reducing the contact width of the source and metal, etc. Since the contact resistance ($R_{CS}$) is inversely proportional to the contact area ($A_C$), a less contact width of the source and metal, on the other hand, increases the contact resistance. In addition, it is also apparent that to obtain a smaller contact window, it requires high process complexity for contact window and metal deposition fabrications. Therefore, the process complexity of the power device will be significantly increased. Based on such reasons, the above-mentioned existing methodologies are normally limited by the minimum width of the contact window, the contact resistance between the source and metal, and so on. And thus, as the device size is getting scaled down nowadays, these existing methodologies are believed as not practical and feasible anymore.

Apart from the above, it has been well known that a standard source metal contact process may be performed as follows: after all the ion implantations and gate fabrication process are completed, a dielectric layer is deposited. Later, a source contact window is formed by employing a lithography process. Subsequently, metal deposition (nickel, for example, is usually used) can be performed. After annealing at a high temperature, the metal (nickel) and silicon carbide react to form Ni-silicide. And after removing the unreacted nickel metal, a structure as illustrated in FIG. 2 of the present invention can be formed. In FIG. 2, the formed Ni-silicide 211 is depicted by a solid pattern. Furthermore, in order to ensure the isolation between the source and the gate regions, a sufficient spacing "S" between the edge of the source contact window and the gate edge must be maintained. In general, the spacing S is usually between 0.5 μm and 1.0 μm. Meanwhile, a sufficient overlapping length "O" of the contact window and the source region, as illustrated in FIG. 2, is also necessary in order to reduce the contact resistance of the source and metal. Such overlapping length O is usually between 0.5 μm and 2.0 μm. At the same time, according to the public methods which have been disclosed in the existing patents and documents, the methods for improving the source contact resistance and reducing the cell pitch are mainly performed based on the self-aligned manners for obtaining a maximum contact area on the basis of the same cell pitch. Therefore, it is believed that the spacing between the contact window and the source region will be affected by the alignment errors of two lithography processes and line widths of two lithography/etching processes. Taking FIG. 2 as the explanatory example, assume that a minimum value of the overlapping length O is 0.5 μm, and the alignment process error is 0.2 μm, then it will be required to design the overlapping length O to be at least 0.7 μm (0.5 μm+0.2 μm=0.7 μm). And yet, even by doing so, when there is an alignment process error or offset generated in the fabrication process, such that the contact areas at the left and right sides of the source region are different, it also results in unfair contact resistances and leads to uneven current distributions. Therefore, the device reliability is degraded. From this point of view, it is obvious that a series of negative effects will thus be generated. As a result, it can be observed that for the current power devices, it is severely important for those skilled in the art to find an effective and balanced methodology for reducing the cell pitch and meanwhile avoiding the above-mentioned drawbacks and negative effects to be generated.

As set forth, on account of the above, in order to overcome the above-mentioned issues, it should be apparent that there is indeed an urgent need for the professionals in the field for a new and novel process method to be developed, that can effectively solve the foregoing problems existing in the prior arts. And by employing the proposed process method, the cell pitch can be effectively reduced under the condition of the same contact area. At the same time, it is believed that the foregoing deficiencies existing in the prior arts are solved as well. Regarding the detailed specific descriptions and implementations, the Applicants of the present invention will be providing in detail in the following paragraphs as below.

SUMMARY OF THE INVENTION

In order to overcome the above-mentioned disadvantages, one major objective in accordance with the present invention is provided for a novel process technology, which is aimed to fabricate a three-dimensional source contact structure between the metal and source region. By adopting the disclosed technical contents of the present invention, it effectively achieves in reducing the cell pitch and maintaining the same contact area at both sides of the source region. Meanwhile, a low process complexity of the disclosed process method can be obtained.

Another major objective in accordance with the present invention is to provide a three-dimensional source contact structure and its fabrication process method of making the same. According to one embodiment of the present invention, a silicon carbide shallow trench process along the metal contact window and a lateral etching process to the inter-layer dielectric are utilized, such that the source contact metal is able to have horizontal surface contact along the silicon carbide surface. And apart from the horizontal surface contact, vertical contact of the source contact metal can be obtained as well. Therefore, based on the process techniques of the present invention, the cell pitch can be reduced by 0.6 to 1.0 µm, which is approximately 10% to 20% of its original cell pitch. In addition, symmetric contact area at both sides of the source region can be achieved as well.

And yet, still one major objective of the present invention is to provide a step-like three-dimensional source contact structure and its fabrication process techniques thereof. By employing the proposed technical contents of the invention, aspect ratio of the metal contact window can be reduced, which is beneficial to the subsequent metal deposition process. Moreover, the proposed technical contents of the present invention can be widely applied to any power transistor which includes the Vertical Double Diffused Metal Oxide Semiconductor Field Effect Transistor (VDMOSFET) structure or the U-shaped Metal Oxide Semiconductor Field Effect Transistors (UMOSFET) structure. And even more, it is believed that a variety of power devices which include the MOSFET structures at its top surface may even be applied thereto as well.

Regarding a practical application, in view of the three-dimensional source contact structure and its fabrication process method, it can be applicable to not only the VDMOSFET and UMOSFET structure in semiconductor devices, but also further to any power transistor which includes the VDMOSFET or UMOSFET structure, for example, an Insulated Gate Bipolar Transistor (IGBT), such that a source contact metal configured therein has a step-like three-dimensional structure.

Therefore, for achieving the above-mentioned objectives, the proposed three-dimensional source contact structure of the present invention is applicable to a power device, wherein the power device includes a semiconductor substrate, and an epitaxial layer and a body region are sequentially formed on the semiconductor substrate. The proposed three-dimensional source contact structure comprises: a source heavily doped area configured on the body region, wherein a metal contact window is formed in the source heavily doped area, such that the source heavily doped area is divided by the metal contact window into a first heavily doped region and a second heavily doped region formed on opposite sides of the metal contact window. An inter-layer dielectric is configured on the source heavily doped area, wherein the inter-layer dielectric is also divided by the metal contact window into a first dielectric layer and a second dielectric layer formed on opposite sides of the metal contact window. The first dielectric layer is disposed on the first heavily doped region. The second dielectric layer is disposed on the second heavily doped region. And a contact length of the first dielectric layer and the first heavily doped region is less than a length of the first heavily doped region such that a first metal-source surface contact region is exposed. In addition, a contact length of the second dielectric layer and the second heavily doped region is less than a length of the second heavily doped region such that a second metal-source surface contact region is exposed.

Subsequently, a source contact metal is thus being deposited between the first dielectric layer and the second dielectric layer, between the first heavily doped region and the second heavily doped region, and on the body region though the metal contact window. The source contact metal covers at least the foregoing first metal-source surface contact region, the second metal-source surface contact region, a longitudinal surface along the first heavily doped region and the second heavily doped region, and an interval surface between the first heavily doped region and the second heavily doped region, such that the source contact metal has a step-like three-dimensional structure.

According to the embodiment of the present invention, the semiconductor substrate of the power device, for instance, can be made of silicon (Si), silicon carbide (SiC), gallium oxide ($Ga_2O_3$), aluminum nitride (AlN), or diamond. And a material of the formed source contact metal may comprise Ni-silicide.

Apart from these, according to the three-dimensional source contact structure disclosed in the present invention, it is obvious that it can certainly be applied to a Vertical Double Diffused Metal Oxide Semiconductor Field Effect Transistor (VDMOSFET) or an U-shaped Metal Oxide Semiconductor Field Effect Transistor (UMOSFET) structure. Alternatively, it can be further widely applied to any power transistor which includes the VDMOSFET or the UMOSFET structure, for example, an Insulated Gate Bipolar Transistor (IGBT). Overall, for people who are skilled in the art and having ordinary knowledge, appropriate modifications or changes based on the technical solutions disclosed in the present invention without departing from the spirit of the present invention are practicable. However, the modifications should still fall into the scope of the present invention. The present invention is certainly not limited thereto the disclosed parameters, conditions, as well as fields of the application.

At the same time, the present invention also discloses a fabrication process method of making the three-dimensional source contact structure, and the fabrication process method includes a plurality of steps as follows.

A power device is firstly provided, which includes the semiconductor substrate, and the epitaxial layer and the body region are sequentially formed on the semiconductor substrate. Later, a source heavily doped area is formed on the body region, wherein a third heavily doped region is buried in the body region, and the third heavily doped region is configured and isolated in the source heavily doped area. Subsequently, an inter-layer dielectric is deposited on the source heavily doped area, and a lithography process is performed to form the metal contact window therein. And then, a shallow trench process is performed along the metal contact window to divide the source heavily doped area into the first heavily doped region and the second heavily doped region through the shallow trench process and the downward extending metal contact window. At this time, the longitudinal surface along the first heavily doped region and the second heavily doped region is exposed. And the interval surface between the first heavily doped region and the second heavily doped region is exposed as well.

Later, a lateral etching process is performed to the inter-layer dielectric to expose the first metal-source surface contact region and the second metal-source surface contact region, and the first dielectric layer and the second dielectric layer are formed. According to the embodiment of the present invention, each of the first dielectric layer and the second dielectric layer is formed in a trapezoid shape. Therefore, on a basis of such structure, the present invention is able to proceed to the next source contact metal deposition process, such that the source contact metal is deposited between the first dielectric layer and the second dielectric layer, between the first heavily doped region and the second heavily doped region, and on the body region. And the source contact metal covers at least the above-mentioned first metal-source surface contact region, the second metal-source surface contact region, the longitudinal surface along the first heavily doped region and the second heavily doped region, and the interval surface between the first heavily doped region and the second heavily doped region. As a result, it is believed that by employing the present invention, the formed source contact metal is able to have the step-like three-dimensional structure.

Furthermore, according to the process technology disclosed in the present invention, the above-mentioned semiconductor substrate, the epitaxial layer, the first heavily doped region and the second heavily doped region have a first semiconductor type. And the body region and the third heavily doped region have a second semiconductor type. And the first semiconductor type and the second semiconductor type are opposite conductivity types. In other words, the present invention is not limited to an N-type or P-type conductivity type. According to the disclosed technique characteristics proposed in the present invention, regarding the following embodiments provided by the present invention disclosed by the Applicants, an N-type silicon carbide is simply used as an illustrative example to implement the semiconductor substrate of the present invention for introducing the technical spirits of the invention. As a result, it is aimed to enable those skilled in the art to fully understand the technical solution of the present invention, and yet not to limit the application of the present invention. In other words, according to the process method disclosed in the present invention, its application field is certainly not limited to the N-type silicon carbide substrate but can also be widely applied to a variety of semiconductor substrates, including transistors with an N-type channel or a P-type channel. Also, substrates made of various semiconductor materials, such as silicon (Si), gallium oxide (Ga$_2$O$_3$), aluminum nitride (AlN), and diamond, etc. are applicable as well.

And yet, moreover, according to the embodiment of the present invention, a length of the exposed first metal-source surface contact region and the second metal-source surface contact region is, for instance, between 0.2 μm and 1.0 μm. Preferably, the length can be 0.3 μm. As for the exposed longitudinal surface, a depth of the longitudinal surface along the first heavily doped region and the second heavily doped region, for instance, can be between 0.2 μm and 0.5 μm. In general, an etching depth of the shallow trench process performed in the present invention, is not less than a thickness of the first heavily doped region and the second heavily doped region, such that a longitudinal surface having sufficient depth along the first heavily doped region and the second heavily doped region can be obtained and exposed.

In one embodiment of the present invention, the above-mentioned lateral etching process can be performed, for instance, by a wet etching process. Overall, generally according to the three-dimensional source contact structure and the fabrication process method for forming the structure disclosed in the present invention, appropriate modifications or variant adjustments are allowed to be made by those skilled in the art and having ordinary knowledge without departing from the spirit of the present invention. Nevertheless, the above-mentioned modifications or variant adjustments should still belong to the claimed scope of the present invention. The present invention is certainly not limited to the disclosed process parameters or their process conditions since the present invention is characterized by having superior process flexibility.

Therefore, to sum up, it is apparent that the present invention discloses a novel process method for achieving a three-dimensional source contact structure. In view of the disclosed process method, the present invention achieves in obtaining the purposes of effectively reducing the cell pitch under the same contact area. At the same time, it also maintains the same contact area at the left and right side of the source region and reduces the process complexity.

Below, the embodiments are described in detail in cooperation with the drawings, so that these and other objectives of the present invention will become obvious to those of ordinary skill in the art after reading the following detailed description of preferred embodiments. And technical contents, characteristics and accomplishments of the invention are easily comprehensive.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings:

FIG. 6 shows a process flow chart illustrating the steps of the proposed fabrication process method of making the three-dimensional source contact structure in accordance with the embodiment of the present invention.

DESCRIPTION OF THE PREFERRED EMBODIMENTS

Figure 1:
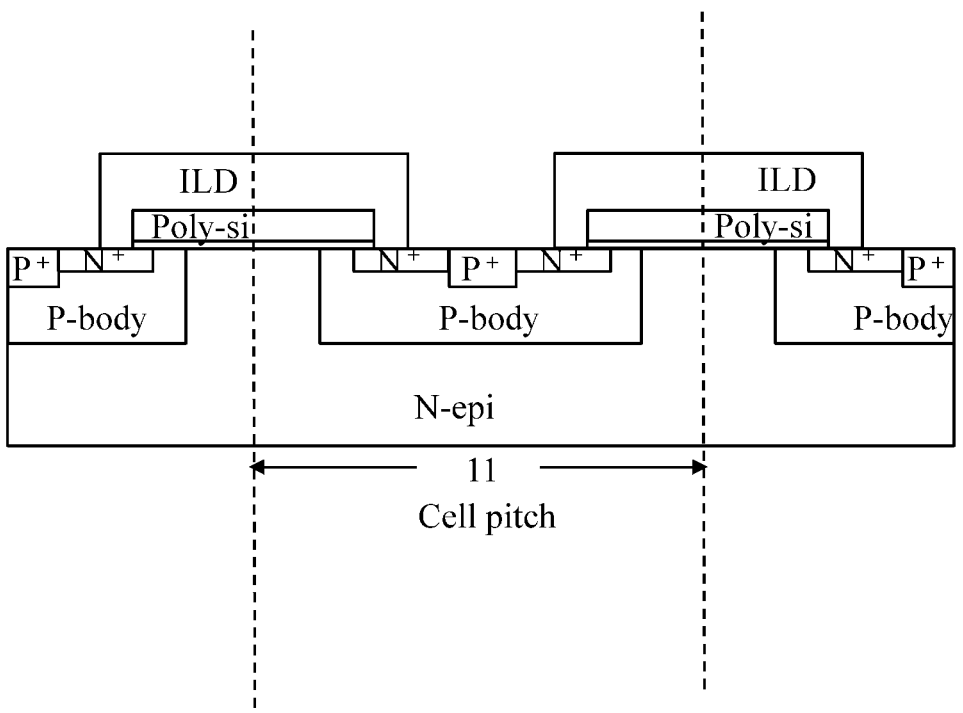
FIG. 1 schematically shows a structural diagram corresponding to a standard source contact metal process used in the prior art.
Figure 2:
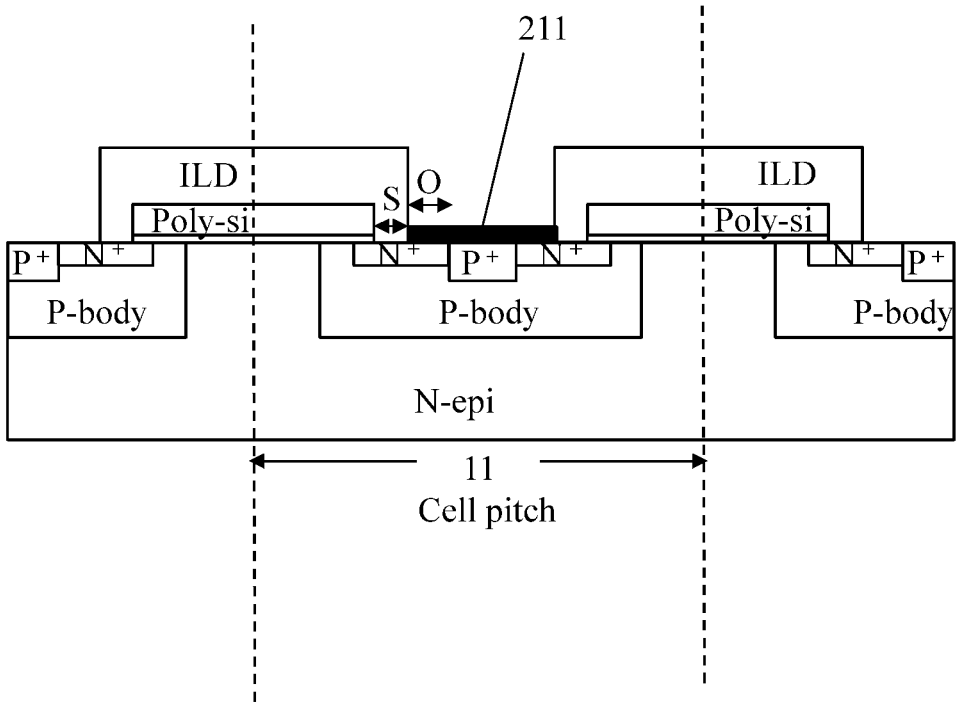
FIG. 2 schematically shows a structural diagram from FIG. 1 in which a Ni-silicide is deposited thereon.

It is to be understood that both the foregoing general description and the following detailed description are exemplary and are intended to provide further explanation of the invention as claimed.

Reference will now be made in detail to the preferred embodiments of the present invention, examples of which are illustrated in the accompanying drawings. Wherever possible, the same reference numbers are used in the drawings and the description to refer to the same or like parts.

The embodiments described below are illustrated to demonstrate the technical contents and characteristics of the present invention and to enable the persons skilled in the art to understand, make, and use the present invention. However, it shall be noticed that, it is not intended to limit the scope of the present invention. Therefore, any equivalent modification or variation according to the spirit of the present invention is to be also included within the scope of the present invention.

Figure 3:
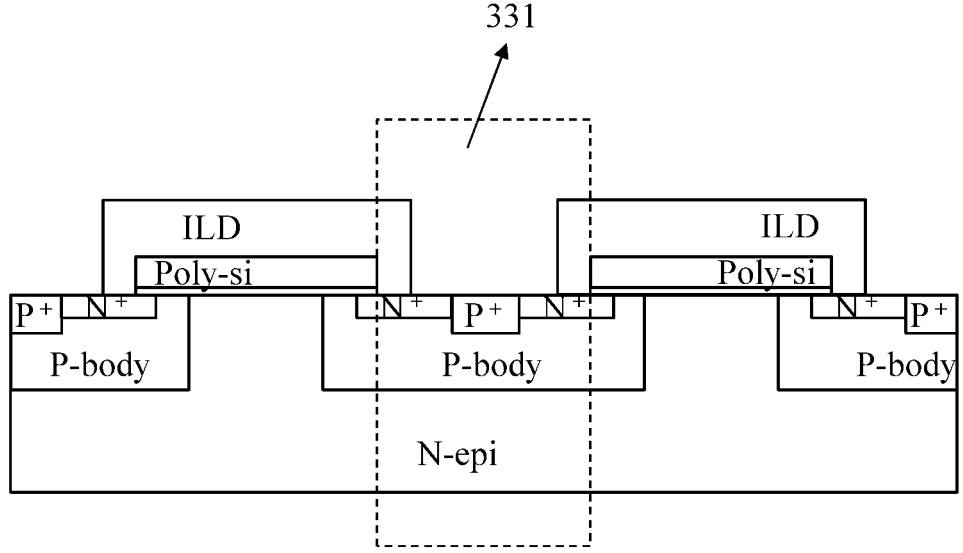
FIG. 3 schematically shows a structural diagram illustrating a source contact region where the modifications of the present invention are configured therein.

The present invention discloses a three-dimensional source contact structure, which is aimed to improve and modify the current contact structure between the source region and metal. One objective of the present invention is to effectively reduce the device cell pitch under the condition of maintaining the same contact area. Meanwhile, contact areas at the left and right sides of the source region can be controlled to have the same area by utilizing a less process complexity manner, thereby making the present invention inventive and advantageous. Since the main technical spirits and solutions are provided based on the source contact structure and its fabrication process method thereof, the rest ion implantation and gate fabrication processes of the transistor are known as being similar to the current standard processes. As such, the similar descriptions are omitted in the present invention, and the applicants of the present invention merely provide detailed descriptions regarding the source contact region 331 where the modifications are made, as illustrated in FIG. 3 for your references.

Figure 4:
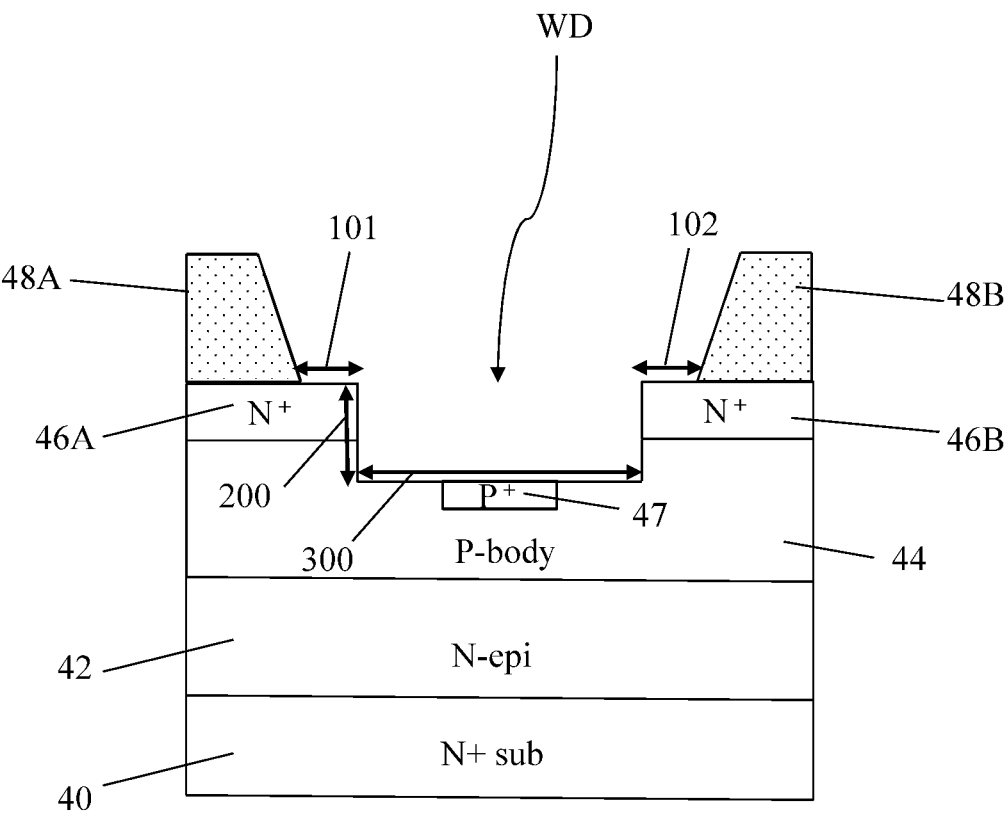
FIG. 4 schematically shows a structural diagram of a three-dimensional source contact structure in accordance with one embodiment of the present invention.
Figure 5:
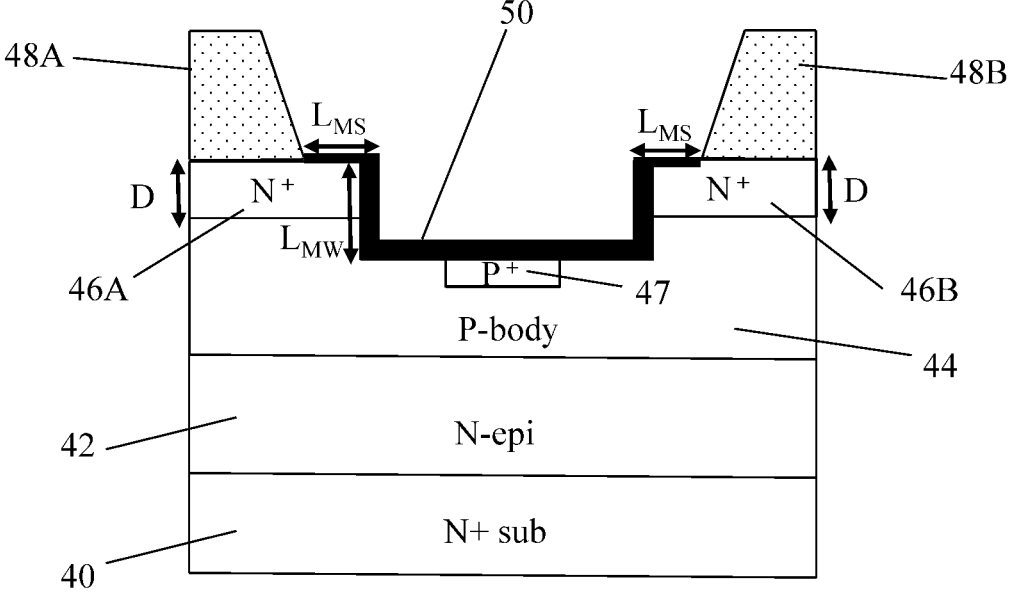
FIG. 5 schematically shows a structural diagram from FIG. 4 in which a source contact metal is deposited.

Please refer to FIG. 4 and FIG. 5, which schematically show a structural diagram of a three-dimensional source contact structure in accordance with one embodiment of the present invention, respectively. As shown in the figures, the disclosed three-dimensional source contact structure can be applied and applicable to a power device. In order to clearly and concisely describe the detailed implementations of the present invention, a basic VDMOSFET structure is used in the following descriptions as an exemplary embodiment for explaining the technical contents of the present invention. However, it should also be noted that such embodiment should not be taken for limiting the claim scope of the present invention. Within the scope of its equality, other variant modifications should still fall into the scope and claims of the present invention.

According to the embodiment of the present invention, the power device includes a semiconductor substrate 40, and an epitaxial layer 42 is formed on the semiconductor substrate 40. Subsequently, a body region 44 is further configured on the epitaxial layer 42. In one preferable embodiment of the present invention, the semiconductor substrate 40 can be a substrate made of N-type heavily doped silicon carbide (shown as "N+ sub" in the figures). And the epitaxial layer 42 (shown as "N-epi" in the figures) can be preferably an N-type SiC (silicon carbide) epitaxial layer which is formed by epitaxial growth on an upper surface of the semiconductor substrate 40. A P-type body implantation process can be utilized to form the body region 44 (shown as "P-body" in the figures). It is noted that the disclosed semiconductor substrate 40 should not be limited to an N-type SiC substrate. Alternative substrates made of other semiconductor materials, such as silicon (Si), gallium oxide ($Ga_2O_3$), aluminum nitride (AlN), and diamond, etc. are also applicable and feasible materials for forming the disclosed semiconductor substrate 40. The detailed descriptions provided in the following paragraphs simply use the N-type silicon carbide material as an illustrative implementation embodiment. Basically, in view of the same technical manners, those skilled in the art and have common knowledge backgrounds in the technical field are allowed to apply the technical solution disclosed in the present invention to the P-type semiconductor substrate, for instance. And the present invention spares the same descriptions.

According to the embodiment of the present invention, a source heavily doped area (shown as "N+" in the figures) is configured on the body region 44. And a metal contact window WD is formed in the source heavily doped area, such that the source heavily doped area is divided by the metal contact window WD into a first heavily doped region 46A (shown as "N+" in the figures) and a second heavily doped region 46B (shown as "N+" in the figures). The first heavily doped region 46A and the second heavily doped region 46B are respectively formed on opposite sides of the metal contact window WD. In addition, a third heavily doped region 47 (shown as "P+" in the figures) is formed underneath the metal contact window WD, and the third heavily doped region 47 is buried in the foregoing body region 44. In such an embodiment, a width of the third heavily doped region 47 is designed as being narrower than a bottom width of the metal contact window WD. However, the present invention is not limited thereto. According to other practicable embodiment of the present invention, the width of the third heavily doped region 47 may also be alternatively designed as being greater than the bottom width of the metal contact window WD, for the purposes of providing a larger metal contact window and a subsequent easier lithography process of the metal contact window. The inventive effects of the present invention may also be implemented through these variant design manners.

An inter-layer dielectric (shown by dotted patterns in the figures) is then further provided on the above-mentioned source heavily doped area. At the same time, the inter-layer dielectric is also divided by the metal contact window WD into a first dielectric layer 48A and a second dielectric layer 48B, which are formed on opposite sides of the metal contact window WD. As can be seen, the first dielectric layer 48A is disposed on the first heavily doped region 46A, and the second dielectric layer 48B is disposed on the second heavily doped region 46B. As illustrated in FIG. 4 and FIG. 5, it is apparent that a contact length of the first dielectric layer 48A and the first heavily doped region 46A is less than a length of the first heavily doped region 46A, such that a first metal-source surface contact region 101 is exposed. Similarly, a contact length of the second dielectric layer 48B and the second heavily doped region 46B is less than a length of the second heavily doped region 46B, such that a second metal-source surface contact region 102 is exposed as well.

By such arrangements, please refer to FIG. 5, then a source contact metal 50 can be deposited between the first dielectric layer 48A and the second dielectric layer 48B, between the first heavily doped region 46A and the second heavily doped region 46B, and on the body region 44 though the metal contact window WD. In addition, it is obvious that the source contact metal 50 covers at least the above-mentioned first metal-source surface contact region 101, the above-mentioned second metal-source surface contact region 102, a longitudinal surface 200 along the first heavily doped region 46A and the second heavily doped region 46B, and an interval surface 300 between the first heavily doped region 46A and the second heavily doped region 46B, such that the source contact metal 50 formed by the present invention has a step-like three-dimensional structure. In general, the source contact metal 50 can be formed, for example, by depositing a contact metal first, such as nickel (Ni), and annealing it at a high temperature to form nickel-silicide (Ni-silicide). After that, a selective etching process can be carried out to remove the unreacted nickel, such that the source contact metal 50 as shown in FIG. 5 can be formed. As a result, according to the embodiment of the present invention, the source contact metal 50 formed by the present invention is able to have a step-like three-dimensional structure. And after that, a variety of subsequent steps are mostly the same as the standard processes in the existing VDMOSFET fabrication process. As for the following gate contact window lithography, etching processes, as well as metal deposition and metal layer lithography processes, these processes may further be performed by those skilled in the art for the subsequent flow processes.

To be more specific, please refer to FIG. 5 for a detailed structural diagram. As can be seen, the exposed first metal-source surface contact region 101 and second metal-source surface contact region 102 has a length $L_{MS}$. And the length $L_{MS}$ of the first metal-source surface contact region 101 and the second metal-source surface contact region 102 can be preferably controlled between 0.2 μm and 1.0 μm. In addition, the exposed longitudinal surface 200 along the first heavily doped region 46A and the second heavily doped region 46B has a depth $L_{MW}$. And the depth $L_{MW}$ of the longitudinal surface 200 can be preferably controlled between 0.2 μm and 0.5 μm. As can be seen from such an embodiment of the present invention, each of the first dielectric layer 48A and the second dielectric layer 48B is formed in a trapezoid shape.

And furthermore, according to the technical contents of the present invention, the above-mentioned length $L_{MS}$ of the exposed first metal-source surface contact region 101 and the second metal-source surface contact region 102 is generally associated with the process parameters of a lateral etching process performed to the inter-layer dielectric. On the other hand, the depth L mw of the exposed longitudinal surface 200 is associated with the process parameters of a shallow trench process performed to the source heavily doped area (N+). Normally, an etching depth of the shallow trench process is approximately close to or slightly more than (not less than) the thickness D of the first heavily doped region 46A and the second heavily doped region 46B, in order to expose a longitudinal surface 200 having sufficient depth $L_{MW}$. Regarding the process method for forming such structure, the applicants of the present invention will be providing in the following sections for your references.

In addition, as previously mentioned, since the present invention is aimed to provide modifications and improvements regarding the source contact region 331 as illustrated in FIG. 3, some other standard structures, such as the dielectric layer and source heavily doped area outside the source contact region or in between the first and second heavily doped regions should be well known by people skilled in the art. Since these technical contents are mostly the current standard processes and are not the main technical spirits claimed by the applicant's invention, these descriptions are not intended to be proposed herein the present invention.

And even furthermore, it should be also noted that, the present invention is not limited by the semiconductor conductivity type used in the embodiments. In other words, according to the present invention, the above-mentioned semiconductor substrate, the epitaxial layer, the first heavily doped region and the second heavily doped region of the disclosed invention have a first semiconductor type. And the body region and the third heavily doped region have a second semiconductor type. The first semiconductor type and the second semiconductor type are opposite conductivity types. Therefore, in one embodiment of the present invention, when the first semiconductor type is N type, the second semiconductor type will be P type. And in an alternative embodiment of the present invention, when the first semiconductor type is P type, then the second semiconductor type will be N type. That is to say, based on the technical solutions provided by the present invention, the disclosed three-dimensional source contact structure can be effectively formed on an N-type heavily doped substrate. And based on the same principles, the disclosed three-dimensional source contact structure may also be applicable to a P-type heavily doped substrate and formed on the P-type heavily doped substrate. The above-mentioned first and second semiconductor types are not intended to limit the claim scopes of the invention.

In view of the foregoing disclosed descriptions regarding the three-dimensional source contact structure formed by the present invention, hereinafter, the applicants of the present invention will be providing its fabrication process method of making the three-dimensional source contact structure in the following sections. For better comprehensive understandings of the present invention, please refer to FIG. 6 for a detailed flow chart illustrating the steps of the fabrication process method, and FIG. 7-FIG. 11 for structural diagrams relatively corresponding to each step of the proposed fabrication process method.

Figures 7, 8:
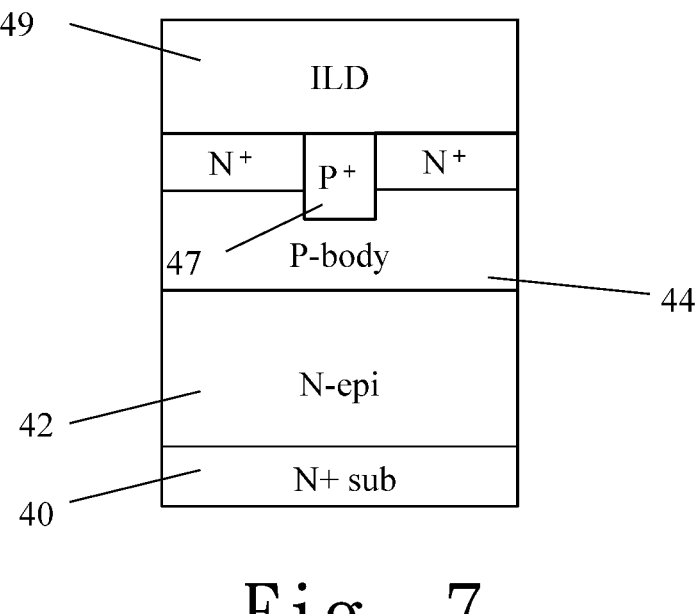
FIG. 7 schematically shows a structural diagram in relative to the proposed fabrication process method in accordance with the embodiment of the present invention.
FIG. 8 schematically shows a structural diagram from FIG. 7 in which a lithography process is performed.

First, as shown in the step of S602, the present invention provides a power device as illustrated in FIG. 7, which includes the semiconductor substrate 40, the epitaxial layer 42 and the body region 44 sequentially formed on the semiconductor substrate 40 as previously described.

Later, as shown in the step of S604, the source heavily doped area (shown as "N+" in FIG. 7) is formed on the body region 44. And the third heavily doped region 47 is buried in the body region 44, and the third heavily doped region 47 is configured and isolated in the source heavily doped area.

And then, as shown in the step of S606, an inter-layer dielectric is deposited on the source heavily doped area. As can be seen in FIG. 7, the inter-layer dielectric is labelled as "ILD" 49. And after that, a lithography process is performed to form the metal contact window WD, as illustrated in FIG. 8.

Figure 9:
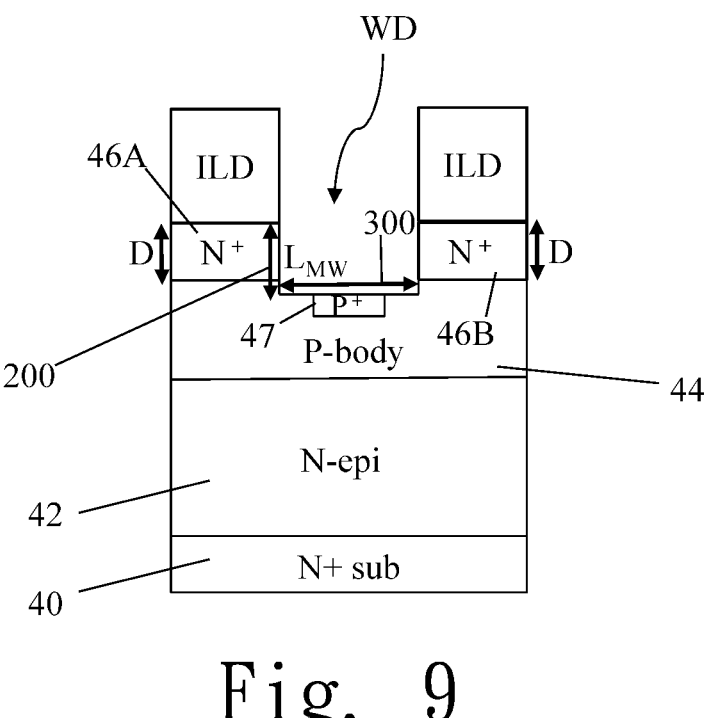
FIG. 9 schematically shows a structural diagram from FIG. 8 in which a shallow trench process is performed.

Subsequently, please refer to FIG. 9 with accompanying process step S608 in FIG. 6, in which the present invention proceeds to perform a shallow trench process along the metal contact window WD such that by the shallow trench process and the downward extending metal contact window WD, the source heavily doped area can be divided into the first heavily doped region 46A and the second heavily doped region 46B which are formed on opposite sides of the metal contact window WD. Meanwhile, due to the shallow trench process, the longitudinal surface 200 as previously described and the interval surface 300 between the first heavily doped region 46A and the second heavily doped region 46B can both be exposed. According to the preferrable embodiment of the present invention, it is applicable to perform the shallow trench process for etching the source heavily doped area (N-type silicon carbide) and controlling the etching depth of the shallow trench process being approximately close to or slightly more than (not less than) the thickness D of the first heavily doped region 46A and the second heavily doped region 46B, in order to expose the longitudinal surface 200 having sufficient depth $L_{MW}$. As a result, the depth $L_{MW}$ of the longitudinal surface 200 can be preferably controlled between 0.2 μm and 0.5 μm.

Figure 10:
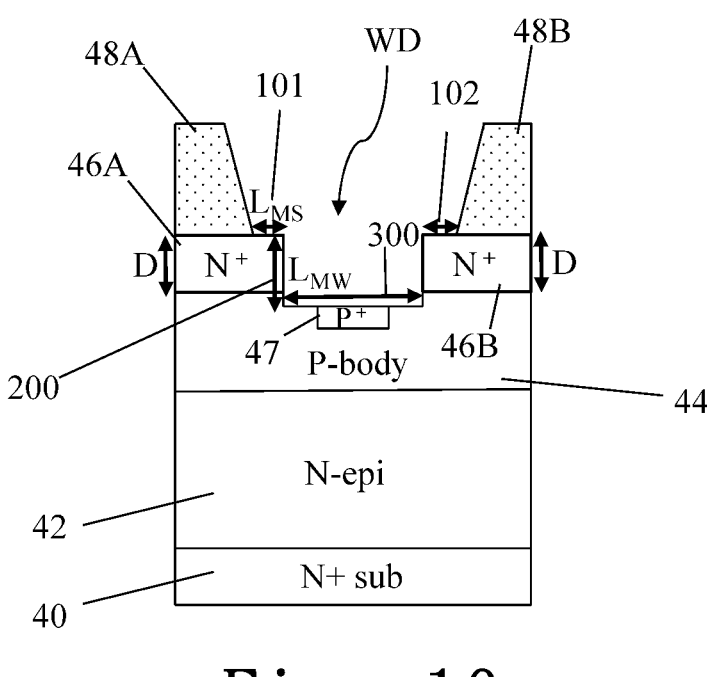
FIG. 10 schematically shows a structural diagram from FIG. 9 in which a lateral etching process is performed to expose the metal-source surface contact regions.

And then, as shown in the step of S610, a lateral etching process can be performed to the inter-layer dielectric, so as to expose the first metal-source surface contact region 101 and the second metal-source surface contact region 102 as indicated in FIG. 10. Meanwhile, the first dielectric layer 48A and the second dielectric layer 48B are formed. According to the embodiment of the present invention, since the exposed first metal-source surface contact region 101 and second metal-source surface contact region 102 are formed by employing the lateral etching process, and the lateral etching process can be, for instance, performed by a wet etching process, an adequate length of the silicon carbide on the surface of the source region can be properly exposed, which is the length $L_{MS}$ of the first metal-source surface contact region 101 and the second metal-source surface contact region 102. According to the present invention, the length $L_{MS}$ of the exposed first metal-source surface contact region 101 and the second metal-source surface contact region 102 can be adjusted by controlling the process parameters of the lateral etching process. Normally, the length $L_{MS}$ can be controlled between 0.2 μm and 1.0 μm, preferably as 0.3 μm.

Figure 11:
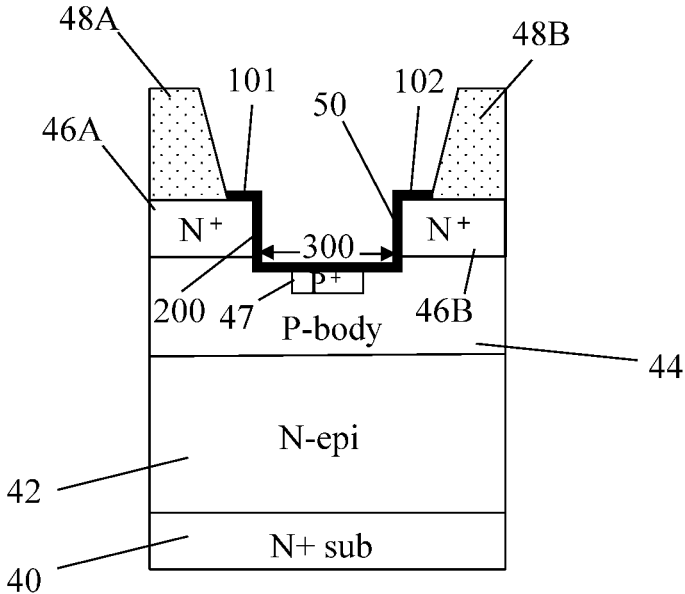
FIG. 11 schematically shows a structural diagram from FIG. 10 in which a source contact metal is deposited thereon.

And therefore, as shown in the step of S612, the present invention is able to proceed to deposit a source contact metal such that the source contact metal 50 as illustrated in FIG. 11 can be formed. On account of the above, the source contact metal 50 formed by employing the disclosed process method is able to cover at least the above-mentioned first metal-source surface contact region 101, the above-mentioned second metal-source surface contact region 102, the longitudinal surface 200 along the first heavily doped region 46A and the second heavily doped region 46B, and the interval surface 300 between the first heavily doped region 46A and the second heavily doped region 46B, such that the source contact metal 50 formed by the present invention has a step-like three-dimensional structure. As earlier described in the previous sections, the source contact metal 50 can be formed, for example, by depositing a contact metal first, such as nickel (Ni), and annealing it at a high temperature to form nickel-silicide (Ni-silicide). After that, a selective etching process can be carried out to remove the unreacted nickel, such that the source contact metal 50 as shown in FIG. 11 can be formed. As a result, according to the embodiment of the present invention, the source contact metal 50 formed by the present invention is characterized by having a step-like three-dimensional structure.

In the following, the Applicants of the present invention further provide a plurality of data to verify the inventive effects of the disclosed invention. Assume that a length of a JFET (Junction Field Effect Transistor) region $L_{JEFT}$ is 1.5 μm, a channel length $L_{CH}$ is 0.5 μm, an overlap length between the gate and source regions $L_{GS}$ is 0.3 μm, a spacing between the gate region and contact window is 0.5 μm, a surface contact length between the metal and source region, which is the formed $L_{MS}$ of the present invention is 0.6 μm, a contact width between the metal and P-body is 0.5 μm, a thickness of the source heavily doped area is 0.3 μm, and a cell pitch of a basic device structure is 5.8 μm. When employing the disclosed technical solutions of the present invention, it is desirable to increase the vertical contact area of the metal and source region, which is the formed $L_{MS}$=0.3 μm. As a result, it is apparent that a total contact length of 0.6 μm can be achieved under the condition when a surface contact length between the metal and source region is reduced to 0.3 μm. And therefore, it is believed that the present invention succeeds in reducing the cell pitch of the transistor structure by 10.3% ($2*L_{MW}$=0.6 μm). And if some other length parameters in the transistor structure can be reduced as well such that its cell pitch configured therein can be further scaled down to 4.0 μm, then it is also applicable to use the disclosed manners of the present invention to reduce the cell pitch by 0.6 μm. Under such circumstances, the yield for reducing cell pitch can be raised up to 15%.

Meanwhile, in view of the laterally etching process of the contact window to expose the source surface by 0.3 μm, it is expected to enlarge the contact window by 0.6 μm and decrease its depth by 0.3 μm. Apart from these, the sidewalls can also be made more inclined, which further facilitates the step-like coverage when metal deposition is performed. It is believed that these are also some other major inventive effects that can be achieved by employing the embodiments disclosed herein the present invention.

In another aspect, as previously described in the present invention, an outline structure of the disclosed first and second dielectric layers is not limited thereto the above-mentioned trapezoid shape in the earlier embodiment. According to other alternative embodiments of the present invention, the first and second dielectric layers may also be formed into various shapes and structures by employing some other adequate etching processes. It will be apparent to those skilled in the art that various modifications and variations can be made without departing from the spirits of the invention, and still fall within the scope of the invention.

To sum up, it should be obvious that the main techniques of the present invention comprise utilizing the silicon carbide shallow trench process to form the vertical contact between the metal and source region (the exposed longitudinal surface) and an alternative lateral etching process applied to the inter-layer dielectric to form the horizontal surface contact between the metal and source region (the exposed first and second metal-source surface contact regions), such that the proposed three-dimensional source contact structure as claimed in the present invention can be accomplished. As set forth, it is believed that by employing the disclosed embodiments and process methods of the present invention, it achieved in effectively reducing not only the cell pitch but also the fabrication process complexity, especially under the condition that the same contact area and symmetric contact area at the left and right sides of the source region can be maintained. Therefore, the technical solutions disclosed in this application are not only advantageous in terms of process complexity and cost considerations, but also valuable in industrial applications. Among all, for people who are skilled in the art and have knowledge in the backgrounds, it should be feasible for adjustments and modifications to be made without departing from the main spirits of the application according to their actual requirements of the transistor type, electrical characteristics, channel lengths, and so on, Nevertheless, based on the equality, it is believed that these variations should still fall into the scope of the application of the present invention.

As a result, in view of the above-mentioned technical features, it is guaranteed that the present invention proposes an extremely novel and inventive process technique. Compared with the prior art, it is believed that the embodiments disclosed in the present invention and the process method thereof can effectively solve the existing deficiencies in the prior art. In addition, according to the fabrication process method disclosed in the present invention, it can be effectively applied to silicon carbide substrate, and further to any other substrate which is made of semiconductor materials, even with a wide energy gap. Apart from these, according to the fabrication process method disclosed in the present invention, it is obvious that the fabrication process method can be applied to a general Vertical Double Diffused Metal Oxide Semiconductor Field Effect Transistor (VDMOSFET) or to a general U-shaped Metal Oxide Semiconductor Field Effect Transistors (UMOSFET). Alternatively, it can be further widely applied to any power transistor which includes the VDMOSFET or the UMOSFET structure, for example, an Insulated Gate Bipolar Transistor (IGBT), such that a three-dimensional source contact structure can be made therein. As a result, the Applicants assert that the present invention is instinct, effective and highly competitive for the incoming technologies, industries and researches developed in the future. And since the technical features, means and effects achieved by the present invention are significantly different from the current solutions and cannot be accomplished easily by those who are familiar with the industry, it is thus believed that the present invention is indeed characterized by patentability and shall be patentable soon in a near future.

It is worth reminding that the present invention is not limited to the above-mentioned process layouts. In other words, those skilled in the art are able to make equivalent modifications and variations based on their actual product specifications. And yet, it is believed that such modified embodiments should still fall within the scope of the present invention.

It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:

1. A fabrication process method of making a three-dimensional source contact structure applicable to a power device, wherein the power device includes a semiconductor substrate, an epitaxial layer and a body region sequentially formed on the semiconductor substrate, and the three-dimensional source contact structure comprises:

a source heavily doped area configured on the body region, wherein a metal contact window is formed in the source heavily doped area, such that the source heavily doped area is divided by the metal contact window into a first heavily doped region and a second heavily doped region formed on opposite sides of the metal contact window;

an inter-layer dielectric configured on the source heavily doped area, wherein the inter-layer dielectric is also divided by the metal contact window into a first dielectric layer and a second dielectric layer formed on opposite sides of the metal contact window, the first dielectric layer is disposed on the first heavily doped region, the second dielectric layer is disposed on the second heavily doped region, and wherein a contact length of the first dielectric layer and the first heavily doped region is less than a length of the first heavily doped region such that a first metal-source surface contact region is exposed, and wherein a contact length of the second dielectric layer and the second heavily doped region is less than a length of the second heavily doped region such that a second metal-source surface contact region is exposed; and a source contact metal being deposited between the first dielectric layer and the second dielectric layer, between the first heavily doped region and the second heavily doped region, and on the body region though the metal contact window, wherein the source contact metal covers at least the first metal-source surface contact region, the second metal-source surface contact region, a longitudinal surface along the first heavily doped region and the second heavily doped region, and an interval surface between the first heavily doped region and the second heavily doped region, such that the source contact metal has a step-like three-dimensional structure, and the fabrication process method comprising:

providing the power device which includes the semiconductor substrate, the epitaxial layer and the body region sequentially formed on the semiconductor substrate;

forming the source heavily doped area on the body region, wherein a third heavily doped region is buried in the body region, and the third heavily doped region is configured and isolated in the source heavily doped area;

depositing the inter-layer dielectric on the source heavily doped area, and performing a lithography process to form the metal contact window;

performing a shallow trench process along the metal contact window to divide the source heavily doped area into the first heavily doped region and the second heavily doped region, and exposing the longitudinal surface along the first heavily doped region and the second heavily doped region and the interval surface between the first heavily doped region and the second heavily doped region;

performing a lateral etching process to the inter-layer dielectric to expose the first metal-source surface contact region and the second metal-source surface contact region and form the first dielectric layer and the second dielectric layer; and depositing the source contact metal between the first dielectric layer and the second dielectric layer, between the first heavily doped region and the second heavily doped region, and on the body region, wherein the source contact metal covers at least the first metal-source surface contact region, the second metal-source surface contact region, the longitudinal surface along the first heavily doped region and the second heavily doped region, and the interval surface between the first heavily doped region and the second heavily doped region, such that the source contact metal has the step-like three-dimensional structure.

2. The fabrication process method according to claim 1, wherein an etching depth of the shallow trench process is not less than a thickness of the first heavily doped region and the second heavily doped region to expose the longitudinal surface along the first heavily doped region and the second heavily doped region.

3. The fabrication process method according to claim 1, wherein the lateral etching process is performed by a wet etching process.

4. The fabrication process method according to claim 1, wherein a length of the first metal-source surface contact region and the second metal-source surface contact region is between 0.2 μm and 1.0 μm.

5. The fabrication process method according to claim 1, wherein a depth of the longitudinal surface along the first heavily doped region and the second heavily doped region is between 0.2 μm and 0.5 μm.

6. The fabrication process method according to claim 1, wherein each of the first dielectric layer and the second dielectric layer is formed in a trapezoid shape.

7. The fabrication process method according to claim 1, wherein a width of the third heavily doped region is alternatively greater than a bottom width of the metal contact window.

8. The fabrication process method according to claim 1, wherein the power device includes a Vertical Double Diffused Metal Oxide Semiconductor Field Effect Transistor (VDMOSFET) or an U-shaped Metal Oxide Semiconductor Field Effect Transistor (UMOSFET), and the step-like three-dimensional structure is applicable to the source contact metal of the VDMOSFET or the UMOSFET.

* * * * *